(12) United States Patent
Kurita et al.

(10) Patent No.: US 6,399,891 B1
(45) Date of Patent: Jun. 4, 2002

(54) MULTILAYER BOARDS

(75) Inventors: Hideyuki Kurita; Masayuki Nakamura, both of Tochigi (JP)

(73) Assignee: Sony Chemicals Corporation, Tokyo (JP)

( * ) Notice: Subject to any disclaimer, the term of this patent is extended or adjusted under 35 U.S.C. 154(b) by 10 days.

(21) Appl. No.: 09/587,386

(22) Filed: Jun. 5, 2000

(30) Foreign Application Priority Data

Jun. 29, 1999 (JP) ............................. 11-183375

(51) Int. Cl.[7] ............................. H05K 1/03; H05K 1/09
(52) U.S. Cl. ..................... 174/256; 174/261; 257/178; 257/747; 361/746
(58) Field of Search ................. 174/261, 148, 174/256, 258; 301/746; 257/178, 633, 747

(56) References Cited

U.S. PATENT DOCUMENTS 5,231,751 A * 8/1993 Sachdev et al. .............. 29/852
5,677,045 A * 10/1997 Nagai et al. .................. 174/48

FOREIGN PATENT DOCUMENTS

| JP | A 63-307797 | 12/1988 |
| JP | A 5-214301 | 8/1993 |
| JP | A-9-199635 | 7/1997 |

* cited by examiner

Primary Examiner—Albert W. Paladini
(74) Attorney, Agent, or Firm—Oliff & Berridge, PLC

(57) ABSTRACT

A multilayer board free from breakage at connecting parts due to thermal fatigue is provided. A multilayer board 1 of the present invention comprises alternating polyimide films 11–16 and copper films 21–26. The polyimide films 11–16 have a thermal expansion coefficient of 2–5 ppm/° C. so that the multilayer board 1 has a total thermal expansion coefficient of less than 10 ppm/° C. Because of the thermal expansion coefficient close to that of the semiconductor element to be mounted, no breakage occurs at connecting parts to the semiconductor element. The multilayer board 1 of the present invention may be used as both interposer and motherboard.

15 Claims, 4 Drawing Sheets

MULTILAYER BOARDS

FIELD OF THE INVENTION

The present invention relates to multilayer boards, and particularly multilayer boards suitable for high-density packaged semiconductor elements.

PRIOR ART

Recently, there is a growing tendency toward high-density packaging of terminals on semiconductors for external connection as patterns of semiconductor elements become finer.

Referring to FIG. 8, the reference numeral 110 represents a semiconductor element comprising an element body 111 in which a fine element such as a transistor is formed. The fine element forms an electronic circuit in said element body 111, and bumps 112 made of solder and for externally connecting the electronic circuit are provided on the surface of the element body 111.

The reference numeral 130 represents a motherboard having a copper wiring with bonding lands on the surface. The semiconductor element 110 cannot be directly mounted on the motherboard 130 because the bumps 112 have a narrower pitch than that of the copper wiring on the motherboard 130.

Thus, the prior art uses an interposer 120 consisting of a resin film 121 on which a fine interconnecting pattern is formed and rough-pitch bumps 122 provided on said resin film 121 to electrically connect the semiconductor element 110 and the motherboard 130, whereby the narrow-pitch bumps 112 on the semiconductor element 110 are connected to the fine interconnecting pattern on the interposer 120 and the pitches are interfaced within the interposer 120 to connect the bumps 122 on the interposer 120 to bonding pads on the motherboard 130.

Recently, such an interposer 120 has a multilayer structure comprising a plurality of conductive layers and resin layers as the number of bumps 112 on the semiconductor element 110 increases.

When the semiconductor element 110 was mounted on the interposer 120 of multilayer structure, however, the problem arose that the bumps 112 on the semiconductor element 110 may be broken.

During investigations of characteristics of the semiconductor element 110 and the interposer 120, we found that the semiconductor element 110 had a thermal expansion coefficient (linear expansion coefficient) of 2.6 ppm/° C. while the interposer 120 of multilayer structure of the prior art had a thermal expansion coefficient of 30 ppm/° C.

This reveals that, when the semiconductor element 110 is mounted on the motherboard 130 through an interposer having such a high thermal coefficient, a great stress occurs at connecting parts due to the difference between the thermal expansion coefficients of the semiconductor element 110 and the interposer, resulting in thermal fatigue and finally breakage at the bumps 112 on the semiconductor element 110.

SUMMARY OF THE INVENTION

An object of the present invention is to overcome the disadvantages of the prior art described above and to provide a multilayer board capable of forming an interposer or motherboard free from breakage at connecting parts.

The present invention provides a multilayer board comprising a plurality of alternating resin layers and conductive layers and having a thermal expansion coefficient of less than 10 ppm/° C. in the spread-wise direction of the board in a layered state.

In one embodiment of the present invention, each resin layer may consist of a polyimide film having a thermal expansion coefficient of less than 10 ppm/° C. in the spread-wise direction of the film and each conductive layer may consist of a metal film having a thermal expansion coefficient of 10 ppm/° C. or more in the spread-wise direction of the film.

In another embodiment of the present invention, at least one of said plurality of resin layers may consist of a first type of polyimide film having a thermal expansion coefficient of 2 ppm/° C. or more but 5 ppm/° C. or less in the spread-wise direction of the film and at least one of the other layers may consist of a second type of polyimide film having a thermal expansion coefficient of more than 5 ppm/° C. but 30 ppm/° C. or less in the spread-wise direction of the film, and said each conductive layer may consist of a metal film having a thermal expansion coefficient of 10 ppm/° C. or more in the spread-wise direction of the film.

When another embodiment of the present invention, at least one of said resin layers may consist of either one of a first type of polyimide film having a thermal expansion coefficient of 2 ppm/° C. or more but 5 ppm/° C. or less in the spread-wise direction of the film or a second type of polyimide film having a thermal expansion coefficient of more than 5 ppm/° C. but 30 ppm/° C. or less in the spread-wise direction of the film, and said each conductive layer may consist of a metal film having a thermal expansion coefficient of 10 ppm/° C. or more in the spread-wise direction of the film.

When the multilayer board has three or more said resin layers and two or more of said resin layers consist of said second type of polyimide film, a resin layer located between said resin layers consisting of said second type of polyimide film may consist of said first type of polyimide film.

When the multilayer board has three or more said resin layers and two or more of said resin layers consist of said first type of polyimide film, however, a resin layer located between said resin layers consisting of said first type of polyimide film may consist of said second type of polyimide film.

In any cases, one of the first or second type of polyimide film may be located nearly in the middle in the direction of the thickness of said multilayer board while the other polyimide film may be located near the surface of said multilayer board.

In a multilayer board of the present invention, a plurality of conductive bumps having a top projecting from the surface of the multilayer board may be provided on at least one face.

Said conductive layer may be partially exposed on at least one face of said multilayer board. Said conductive bumps may be provided on the same face on which said conductive layer is exposed or the opposite face.

Semiconductor elements such as IC, LSI or discrete elements may be connected to multilayer boards described above to constitute semiconductor devices.

In multilayer boards of the present invention of the structure described above, the connecting parts between semiconductor elements and the multilayer boards are subjected to less thermal stress and therefore less liable to be broken by thermal fatigue because of the thermal expansion coefficient close to that of the semiconductor elements of 2.6 ppm/° C.

When multilayer boards of the present invention are used as an interposer inserted between a motherboard and a semiconductor element, considerable thermal contraction of the motherboard can be avoided because the thermal expansion coefficient of multilayer boards of the present invention lies between the thermal expansion coefficient of the motherboard of 13–17 ppm/° C. and the thermal expansion coefficient of the semiconductor element of 2.6 ppm/° C.

When one wishes to obtain a multilayer board having a thermal expansion coefficient of less than 10 ppm/° C. using conductive layers having a thermal expansion coefficient of 10 ppm/° C. or more, such conductive layers may be combined with resin layers having a thermal expansion coefficient of less than 10 ppm/° C.

If one wishes to obtain a multilayer board having a desired thermal expansion coefficient, resin layers having varying thermal expansion coefficients may be combined with conductive layers because it is difficult to control the intrinsic thermal expansion coefficients of the conductive layers or resin layers. When resin layers having varying thermal expansion coefficients are used, those having a thermal expansion coefficient of more than 10 ppm/° C. may be combined with those having a thermal expansion coefficient of less than 10 ppm/° C.

As described above, because the thermal expansion coefficient of a multilayer board of the present invention is close to that of semiconductor element, no breakage occurs at connecting parts due to thermal fatigue.

Figure 1:
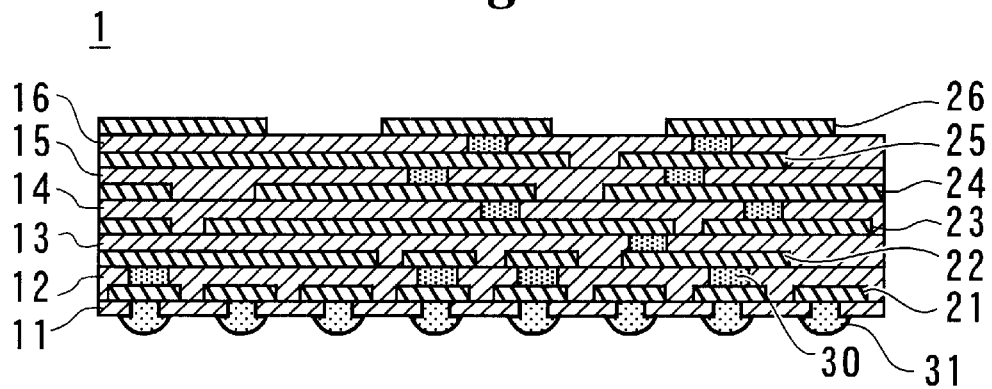
FIG. 1 is a sectional view of a multilayer board according to a first embodiment of the present invention.

The reference numerals represent the following elements: 1–5, 9: multilayer board; 11–15, $A_1$–$A_5$: resin layer (polyimide film); 21–26, $B_1$–$B_6$: conductive layer (copper film).

DETAILED DESCRIPTION OF THE INVENTION

Figure 7:
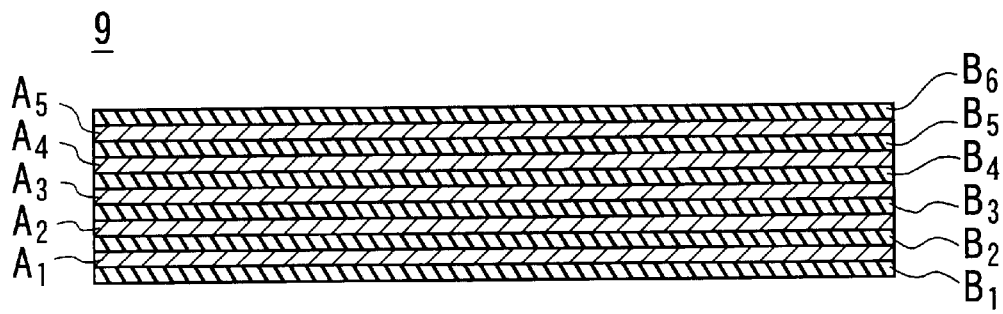
FIG. 7 is a sectional view of a multilayer board of the present invention used for evaluations.
Figure 8:
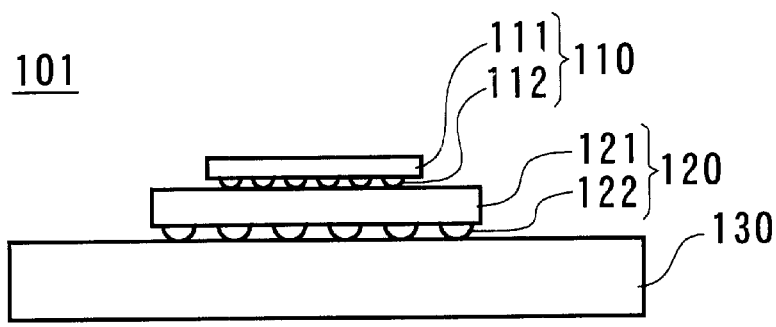
FIG. 8 is an explanatory view of an interposer of the prior art.

Referring to FIG. 7, the reference numeral 9 represents a multilayer board according to one embodiment of the present invention.

This multilayer board 9 comprises five resin layers $A_1$–$A_5$ and six conductive layers $B_1$–$B_6$ alternately deposited in this order.

The conductive layers $B_1$–$B_6$ were made of a copper film having a thickness of 12 μm and a thermal expansion coefficient of 21 ppm/° C., and the resin layers $A_1$–$A_5$ were made of various polyimide films. First to third evaluation multilayer boards were prepared with varying combinations of the thermal expansion coefficients and the film thickness of polyimide films, and the thermal expansion coefficients were measured. The evaluation results are shown in the following Table 1.

TABLE 1

| | | Evaluation Results | | | | | |
|---|---|---|---|---|---|---|---|
| | | First Evaluation Board | | Second Evaluation Board | | Third Evaluation Board | |
| Film Type | Location | Thermal expansion coefficient ppm/C° | Thickness um | Thermal expansion coefficient ppm/C° | Thickness um | Thermal expansion coefficient ppm/C° | Thickness um |
| Polyimide Film | $A_1$ | 3 | 20 | 15 | 20 | 4 | 20 |
| | $A_2$ | 3 | 20 | 3 | 20 | 4 | 20 |
| | $A_3$ | 3 | 20 | 3 | 20 | 18 | 20 |
| | $A_4$ | 3 | 20 | 3 | 20 | 4 | 20 |
| | $A_5$ | 3 | 20 | 15 | 20 | 4 | 20 |
| Copper Film | $B_1$ | 21 | 12 | 21 | 12 | 21 | 12 |
| | $B_2$ | 21 | 12 | 21 | 12 | 21 | 12 |
| | $B_3$ | 21 | 12 | 21 | 12 | 21 | 12 |
| | $B_4$ | 21 | 12 | 21 | 12 | 21 | 12 |
| | $B_5$ | 21 | 12 | 21 | 12 | 21 | 12 |
| | $B_6$ | 21 | 12 | 21 | 12 | 21 | 12 |
| Total | | 6 | 172 | 7 | 172 | 7 | 172 |

In the first evaluation board, all the five polyimide films (resin layers) $A_1$–$A_5$ had a thermal expansion coefficient of 5 ppm/° C. or less (3 ppm/° C. for all layers here) in the spread-wise direction of the film.

In the second evaluation board, the three polyimide films $A_2$–$A_4$ in the middle in the direction of the thickness of the multilayer board 9 had a thermal expansion coefficient of 2 ppm/° C. or more but 5 ppm/° C. or less (3 ppm/° C. for all three layers here) while the polyimide films $A_1$, $A_5$ on surface sides had a thermal expansion coefficient of more than 5 ppm/° C. but 30 ppm/° C. or less (15 ppm/° C. here).

Contrary to the second evaluation board, the third evaluation board used a material having a thermal expansion coefficient of more than 5 ppm/° C. but 30 ppm/° C. or less (18 ppm/° C. here) for only one polyimide film $A_3$ in the middle in the direction of the thickness of the multilayer board 9 while the polyimide films $A_1$, $A_2$, $A_4$, $A_5$ on surface sides had a thermal expansion coefficient of 2 ppm/° C. or more but 5 ppm/° C. or less (4 ppm/° C. for all four layers here).

Table 1 shows that each of the first to third evaluation boards has a total thermal expansion coefficient of less than 10 ppm/° C.

Polyimide films having a thermal expansion coefficient of 3 ppm/° C. can be obtained by reacting an acid such as pyromellitic anhydride or 3,4,3',4'-biphenyltetracarboxylic dianhydride with an amine such as paradiaminobiphenyl, 3,3-dimethyl-4,4-diaminobiphenyl, 2-methylparadiaminobenzene.

Suitable acids for forming a polyimide film having a thermal expansion coefficient of 15 ppm/° C. include pyromellitic anhydride, 3,4,3',4'-biphenyltetracarboxylic dianhydride, etc. Suitable amines include 3,3'-dimethoxy-4,4'-diaminobiphenyl, 4,4'-diaminobiphenylether, diaminopyridine, 4,4'-diaminobenzene anilide, etc.

EXAMPLE

Now, processes for mounting semiconductor elements on multilayer boards of the present invention are described.

Referring to FIG. 1, the reference numeral 1 represents a multilayer board according to a first embodiment of the present invention.

This multilayer board 1 has six resin layers 11–16 and six conductive layers 21–26.

The conductive layers 21–26 consist of a copper film having a thickness of 12 μm and the resin layers 11–16 consist of a polyimide film.

The conductive layers 21–26 and the resin layers 11–16 are alternately deposited so that the conductive layers 21–26 cannot be mutually contacted.

Holes are formed at predetermined sites in the resin layers 12–16 inserted between the conductive layers 21–26. Each hole is filled with an electrically conductive material (copper here) by plating or other means so that the filler forms a plug 30.

Each conductive layer 21–26 is patterned in a predetermined configuration to form a wiring extending in the spread-wise direction of the film of each conductive layer 21–26. The wirings of various layers are electrically connected to each other via plugs 30.

This multilayer board 1 has bonding lands formed of the conductive layer 26 exposed on the surface whereby bumps on a semiconductor element or the like can be connected to the bonding lands.

On the bottom side, conductive bumps (copper bumps here) 31 are provided on the lowermost conductive layer 21. The conductive layer 21 on the bottom side is covered with a resin layer 11 except that only the tops of the conductive bumps 31 project from the resin layer 11.

EXAMPLE

Figure 2A:
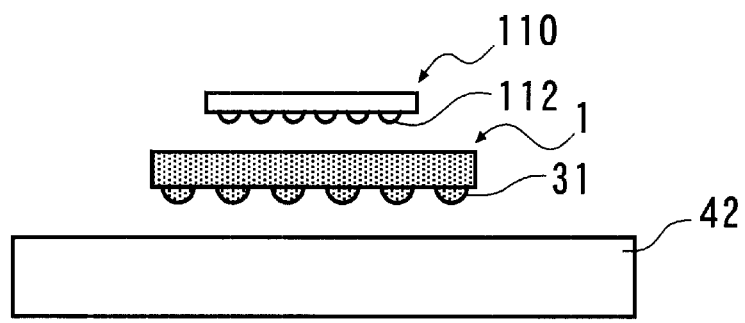
FIGS. 2a, 2b are an explanatory view of a multilayer board and a semiconductor device according to a first embodiment of the present invention.
Figure 2B:
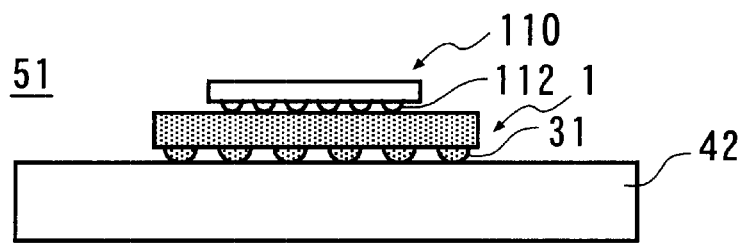

The reference numeral 1 in FIG. 2a represents the multilayer board according to the first embodiment described above, and a semiconductor device 51 of the present invention as shown in FIG. 2b is obtained by establishing a connection in such a manner that the conductive bumps 31 on the multilayer board 1 face the interconnecting pattern on the surface of the motherboard 42 and bumps 112 on a semiconductor element 110 face the conductive layer 26 of the multilayer board 1. In this semiconductor device 51, the electronic circuit in the semiconductor element 110 is connected to the interconnecting pattern on the motherboard 42 through the conductive layers 21–26 and plugs 30 in the multilayer board 1.

The multilayer board 1 of this layered structure (as well as multilayer boards 2–5 according to the second and the subsequent embodiments described below) has a total thermal expansion coefficient of less than 10 ppm/° C. in the spread-wise direction so that the bumps 112 on the semiconductor element 110 or the conductive bumps 31 on the multilayer board 1 are free from breakage due to thermal fatigue.

EXAMPLE

Figure 3A:
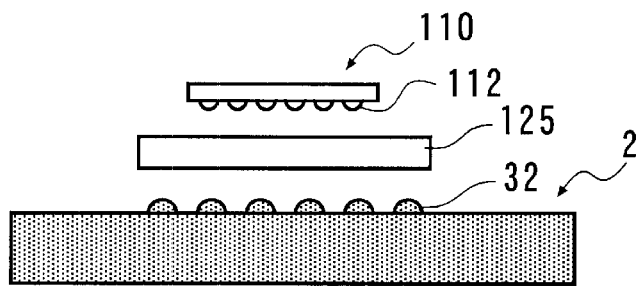
FIGS. 3a, 3b are an explanatory view of a multilayer board and a semiconductor device according to a second embodiment of the present invention.
Figure 3B:
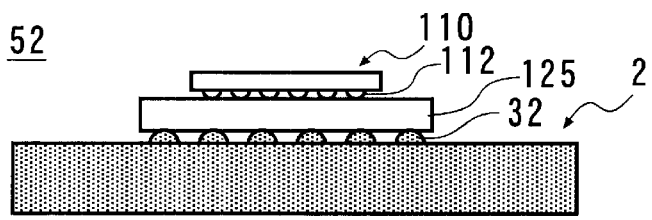

Referring to FIG. 3, the reference numeral 2 represents a multilayer board according a second embodiment of the present invention, which has a similar structure to that of the multilayer board 1 according to the first embodiment.

Here, the multilayer board 2 according to the second embodiment is used in place of the motherboard 42 shown in FIGS. 2a, 2b, and a semiconductor device 52 is prepared by connecting conductive bumps 32 on the surface of the multilayer board 2 to bumps 112 on a semiconductor element 110 through an interposer 125 having no bumps.

Similarly to the multilayer board 1 according to the first embodiment, the bumps on the semiconductor element 110 of the semiconductor device 52 are free from breakage by using the interposer 125 consisting of a monolayer board having a thermal expansion coefficient close to that of the metal film (copper film).

EXAMPLE

Figure 4A:
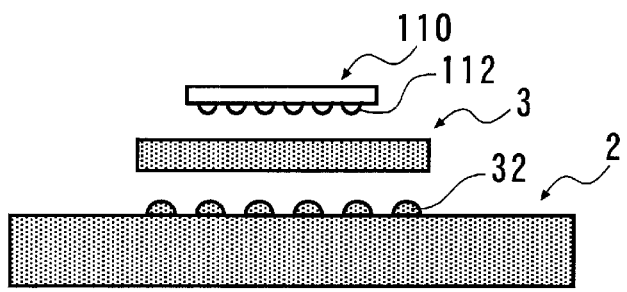
FIGS. 4a, 4b are an explanatory view of a multilayer board and a semiconductor device according to a third embodiment of the present invention.
Figure 4B:
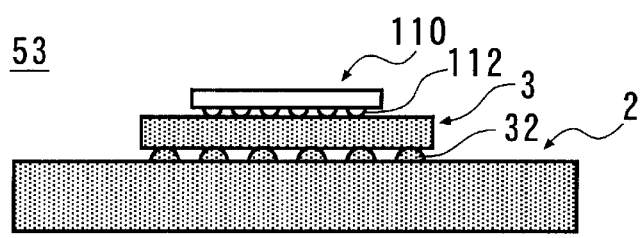

Referring to FIGS. 4a, 4b, the reference numeral 2 represents the same multilayer board according to the second embodiment of the present invention as shown in FIG. 3(a), (b), and the reference numeral 3 represents a multilayer board according to a third embodiment of the present invention having bonding lands on both top and bottom surfaces.

A third semiconductor device 53 of the present invention is prepared by using the multilayer board 3 according to the third embodiment as an interposer inserted between a semiconductor element 110 and the multilayer board 2 as shown in FIG. 4a and connecting bumps 112 on the semiconductor element and the bumps 32 on the multilayer board 3 according to the second embodiment to the bonding lands on the multilayer board 3 according to the third embodiment.

EXAMPLE

Figure 5A:
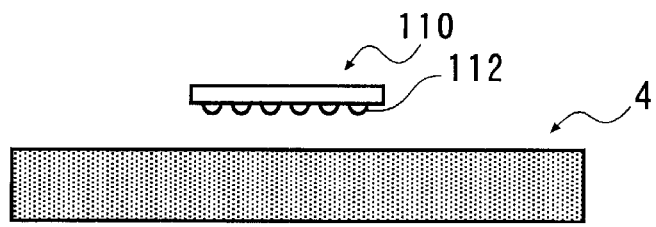
FIGS. 5a, 5b are an explanatory view of a multilayer board and a semiconductor device according to a fourth embodiment of the present invention.
Figure 5B:
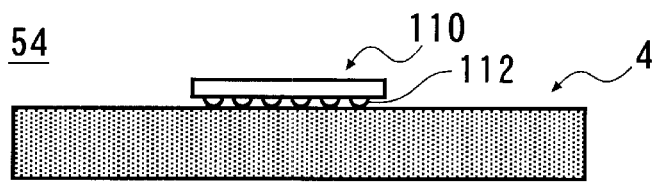

Referring to FIGS. 5a, 5b, the reference numeral 4 represents a multilayer board according to a fourth embodiment of the present invention. This multilayer board 4 has no bumps, and a semiconductor device 54 of the present invention is prepared by directly connecting bumps 112 on a semiconductor element 110 to bonding lands on the surface.

EXAMPLE

Figure 6A:
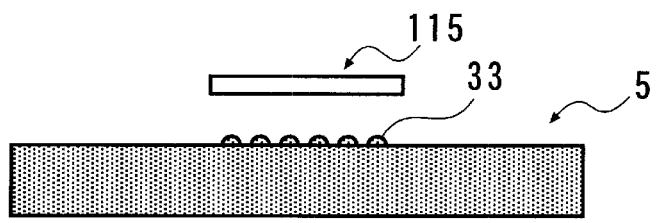
FIGS. 6a, 6b are an explanatory view of a multilayer board and a semiconductor device according to a fifth embodiment of the present invention.
Figure 6B:
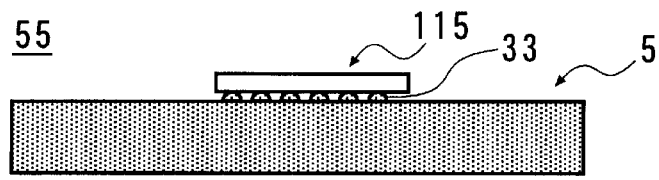

Referring to FIGS. 6a, 6b, the reference numeral 5 represents a multilayer board according to a fifth embodiment of the present invention. This multilayer board 5 has narrow-pitch bumps 33 exposed on the surface, and a semiconductor device 55 of the present invention is obtained by abutting bonding lands on a semiconductor element 115 having no bumps against the tops of the narrow-pitch bumps 33 to connect them.

The foregoing description demonstrates that multilayer boards of the present invention can be used as both motherboards and interposers. Multilayer boards of the present invention may or may not have bumps. A conductive layer consisting of a copper film or the like may be exposed on the surface or protected with a resin layer consisting of a polyimide film or the like.

Conductive layers used in multilayer boards and semiconductor devices of the present invention are not limited to copper films, and resin layers are not limited to polyimide films. Each conductive layer may be plated with copper, aluminum, gold, silver or the like or may consist of layers of these different conductive materials. Each resin layer may consist of resin layers having different thermal expansion coefficients, resin layers of resins other than polyimide resin such as acrylic resin epoxy resin, layered resins other than polyimide resins, or layered resin layers of resins other than polyimide resins and polyimide films.

What is claimed is:

1. A multilayer board, comprising:
   a plurality of alternating resin layers, each of said resin layer including a polyimide film having a thermal expansion coefficient of less than 10 ppm/° C. in a spread-wise direction of the film; and
   conductive layers, each of said conductive layer including a metal film having a thermal expansion coefficient of 10 ppm/° C. or more in the spread-wise direction of the film.

2. The multilayer board according to claim 1, wherein at least one of said plurality of resin layers includes a first type of polyimide film having a thermal expansion coefficient of 2 ppm/° C. or more but 5 ppm/° C. or less in the spread-wise direction of the film and at least one of the other layers includes a second type of polyimide film having a thermal expansion coefficient of more than 5 ppm/° C. but 30 ppm/° C. or less in the spread-wise direction of the film.

3. The multilayer board according to claim 2 having three or more said resin layers, wherein at least two or more of said resin layers consist of said second type of polyimide film and a resin layer located between said resin layers consisting of said second type of polyimide film consists of said first type of polyimide film.

4. The multilayer board according to claim 2 having three or more said resin layers, wherein at least two or more of said resin layers consist of said first type of polyimide film and a resin layer located between said resin layers consisting of said first type of polyimide film consists of said second type of polyimide film.

5. The multilayer board according to claim 2, wherein a plurality of conductive bumps having a top projecting from the surface of said multilayer board are provided on at least one face of said multilayer board.

6. The multilayer board according to claim 5, wherein said metal layer is partially exposed on at least the face opposite to the face on which said conductive bumps are provided.

7. The multilayer board according to claim 2, wherein said conductive layer is partially exposed on at least one face of said multilayer board.

8. The multilayer board according to claim 1, wherein at least one of said resin layers has either one of a first type of polyimide film having a thermal expansion coefficient of 2 ppm/° C. or more but 5 ppm/° C. or less in the spread-wise direction of the film or a second type of polyimide film having a thermal expansion coefficient of more than 5 ppm/° C. but 30 ppm/° C. or less in the spread-wise direction of the film.

9. The multilayer board according to claim 1, wherein a plurality of conductive bumps having a top projecting from the surface of said multilayer board are provided on at least one face of said multilayer board.

10. The multilayer board according to claim 9, wherein said metal layer is partially exposed on at least the face opposite to the face on which said conductive bumps are provided.

11. The multilayer board according to claim 1, wherein said conductive layer is partially exposed on at least one face of said multilayer board.

12. A semiconductor device, comprising:
    a multilayer board comprising a plurality of alternating resin layers, each of said resin layer of said multilayer board including a polyimide film having a thermal expansion coefficient of less than 10 ppm/° C. in a spread-wise direction of the film;
    conductive layers, each of said conductive layer including a metal film having a thermal expansion coefficient of 10 ppm/° C. or more in the spread-wise direction of the film; and
    a semiconductor element connected to at least one of said conductive layers.

13. The semiconductor device according to claim 12, wherein at least one of said plurality of resin layers of said multilayer board includes a first type of polyimide film having a thermal expansion coefficient of 2 ppm/° C. or more but 5 ppm/° C. or less in the spread-wise direction of the film and at least one of the other layers consists of a second type of polyimide film having a thermal expansion coefficient of more than 5 ppm/° C. but 30 ppm/° C. or less in the spread-wise direction of the film.

14. The semiconductor device according to claim 12, wherein at least one of said resin layers of said multiplayer board includes either one of a first type of polyimide film having a thermal expansion coefficient of 2 ppm/° C. or more but 5 ppm/° C. or less in the spread-wise direction of the film or a second type of polyimide film having a thermal expansion coefficient of more than 5 ppm/° C. but 30 ppm/° C. or less in the spread-wise direction of the film.

15. The semiconductor device according to claim 12 wherein a plurality of conductive bumps having a top projecting from the surface of said multilayer board are provided on the face of said multilayer board opposite to the face on which said semiconductor element of said multilayer board is mounted.

* * * * *